(12) United States Patent
Kim et al.

(10) Patent No.: US 12,354,996 B2
(45) Date of Patent: Jul. 8, 2025

(54) GLASS CARRIER FOR DIE-UP FAN-OUT PACKAGING AND METHODS FOR MAKING THE SAME

(71) Applicant: CORNING INCORPORATED, Corning, NY (US)

(72) Inventors: Jin Su Kim, Seoul (KR); Yu Xiao, Pittsford, NY (US)

(73) Assignee: CORNING INCORPORATED, Corning, NY (US)

( * ) Notice: Subject to any disclaimer, the term of this patent is extended or adjusted under 35 U.S.C. 154(b) by 384 days.

(21) Appl. No.: 17/435,574

(22) PCT Filed: Feb. 24, 2020

(86) PCT No.: PCT/US2020/019419
§ 371 (c)(1),
(2) Date: Sep. 1, 2021

(87) PCT Pub. No.: WO2020/180515
PCT Pub. Date: Sep. 10, 2020

(65) Prior Publication Data
US 2022/0149004 A1    May 12, 2022

Related U.S. Application Data

(60) Provisional application No. 62/815,125, filed on Mar. 7, 2019.

(51) Int. Cl.
*H01L 23/15* (2006.01)
*H01L 23/00* (2006.01)

(52) U.S. Cl.
CPC .............. *H01L 24/96* (2013.01); *H01L 23/15* (2013.01); *H01L 24/19* (2013.01);
(Continued)

(58) Field of Classification Search
CPC ...................................................... H01L 23/15
See application file for complete search history.

(56) References Cited

U.S. PATENT DOCUMENTS

| 4,764,233 A | 8/1988 | Ogihara et al. |
| 5,408,362 A | 4/1995 | Krim |

(Continued)

FOREIGN PATENT DOCUMENTS

| JP | H04-295682 A | 10/1992 |
| JP | 4295682 B2 | 7/2009 |

(Continued)

OTHER PUBLICATIONS

Azemar et al., "Fan-out packaging: What can explain such a great potential?" Chip Scale Review, May/Jun. 2015, 5-8.
(Continued)

*Primary Examiner* — Mohammad M Choudhry
(74) *Attorney, Agent, or Firm* — Kevin M. Able; Daniel J. Greenhalgh (57) ABSTRACT

A wafer- or panel-level encapsulated package comprises a glass substrate comprising a glass cladding layer (105) fused to a glass core layer (110), the glass substrate comprising a cavity (425), wherein the glass cladding layer has a higher etch rate in an etchant than the glass core layer. The wafer- or panel-level encapsulated package further comprises a microelectronic component (700) disposed in the cavity, and an encapsulant (702) sealed to the glass substrate such that the microelectronic component is encapsulated within the cavity. Methods for forming the wafer- or panel-level encapsulated package, including etching a cavity into a glass substrate, depositing a microelectronic component into the cavity, and sealing an encapsulant to the glass substrate such that the microelectronic component is encapsulated within the cavity are also provided.

19 Claims, 4 Drawing Sheets

(52) U.S. Cl.
CPC ............... *H01L 2224/73267* (2013.01); *H01L 2224/92244* (2013.01); *H01L 2924/15788* (2013.01)

(56) References Cited

U.S. PATENT DOCUMENTS

| | | | |
|---|---|---|---|
| 5,900,675 | A | 5/1999 | Appelt et al. |
| 6,399,892 | B1 | 6/2002 | Milkovich et al. |
| 6,580,864 | B1 | 6/2003 | Temkin et al. |
| 6,586,352 | B1 | 7/2003 | Blumberg et al. |
| 6,841,026 | B2 | 1/2005 | Blumberg et al. |
| 7,307,032 | B2 | 12/2007 | Miyauchi et al. |
| 8,012,807 | B2 | 9/2011 | Meyer et al. |
| 8,147,927 | B2 | 4/2012 | Zimmer et al. |
| 8,497,587 | B2 | 7/2013 | Ma |
| 8,535,978 | B2 | 9/2013 | Scanlan |
| 8,836,780 | B2 | 9/2014 | Weiss et al. |
| 9,340,451 | B2 | 5/2016 | Boek et al. |
| 9,754,924 | B2 | 9/2017 | Chung |
| 2008/0173792 | A1* | 7/2008 | Yang ............... H01L 27/14636 250/208.1 |
| 2009/0267102 | A1* | 10/2009 | Tsai ................... H01L 33/56 257/E33.056 |
| 2010/0062564 | A1 | 3/2010 | Sakaguchi et al. |
| 2012/0017975 | A1 | 1/2012 | Giron et al. |
| 2013/0256710 | A1* | 10/2013 | Andrews ............ H01L 25/0753 438/28 |
| 2014/0238078 | A1* | 8/2014 | Boek .................. C03C 21/002 65/33.2 |
| 2015/0049498 | A1 | 2/2015 | Zhou |
| 2015/0108667 | A1* | 4/2015 | Lai ........................ B29C 39/26 438/107 |
| 2016/0268236 | A1 | 9/2016 | Chung |
| 2016/0329257 | A1* | 11/2016 | Scanlan ................ H01L 24/96 |
| 2017/0073266 | A1 | 3/2017 | Amosov et al. |

FOREIGN PATENT DOCUMENTS

| | | | | |
|---|---|---|---|---|
| JP | 2010-062430 | A | | 3/2010 |
| JP | 4610114 | B2 | | 1/2011 |
| JP | 2018-121043 | A | | 8/2018 |
| KR | 20090067211 | A | * | 6/2009 |
| KR | 10-1139410 | B1 | | 4/2012 |
| KR | 10-1393699 | B1 | | 5/2014 |
| KR | 10-1393700 | B1 | | 5/2014 |
| KR | 10-1393701 | B1 | | 5/2014 |
| WO | WO-2012134025 | A1 | * | 10/2012 ............ G02B 6/125 |
| WO | 2017/196800 | A1 | | 11/2017 |
| WO | 2019/023213 | A1 | | 1/2019 |

OTHER PUBLICATIONS

Fan-out wafer-level packaging extending the platform. Chip Scale Review Mar./Apr. 2013, 36-41.
International Search Report and Written Opinion of the International Searching Authority; PCT/US2020/019419; dated Apr. 28, 2020; 16 pages; European Patent Office.
Interposers: What's different this time around. Chip Scale Review Mar./Apr. 2013, 9-10.
Keser et al., "Advanced packaging: The redistributed chip package", IEEE Transactions on Advanced Packaging, vol. 31, 2008, pp. 39-43.
Lee et al., "Numerical analysis of warpage and reliability of fan-out wafer-level package", Journal of the Microelectronics & Packaging Society, vol. 21, 2014, pp. 31-39.
Meyer et al., "Embedded wafer-level ball grid array (eWLB)", 10th Electronics Packaging Technology Conference, 2008, pp. 994-998.
Shorey et al., "Glass substrates for carrier and interposer applications and associated metrology solutions", Advanced Semiconductor Manufacturing Conference 2013, pp. 142-147.
WLPs in a OSAT world: The top ten OSAT WLP assemblers. Chip Scale Review, Mar./Apr. 2013, pp. 24-26.
Korean Patent Application No. 10-2021-7029892, Office Action dated Feb. 14, 2025, 4 pages (English Translation only), Korean Patent Office.

* cited by examiner

GLASS CARRIER FOR DIE-UP FAN-OUT PACKAGING AND METHODS FOR MAKING THE SAME

CROSS-REFERENCE TO RELATED APPLICATIONS

This application claims the benefit of priority under 35 U.S.C. § 371 of International Application No. PCT/US2020/019419, filed on Feb. 24, 2020, which claims the benefit of priority under 35 U.S.C. § 119 of U.S. Provisional Application Ser. No. 62/815,125 filed on Mar. 7, 2019, the content of each of which is relied upon and incorporated herein by reference in its entirety.

FIELD

This disclosure relates to glass carriers for use as fan-out packaging and methods for making the same. In addition, this disclosure relates to integrated circuit packages comprising the glass carriers and methods for making the same.

TECHNICAL BACKGROUND

Structured glass articles can have cavities or channels that can be useful for a variety of applications, including, by way of example and not limitation, integrated circuit packages, optical encapsulation, and micro fluidic devices. Heterogeneous integration of microelectronic components (e.g., chips, antennas, and sensors) is an effective way to utilize high density packaging formed from structured glass articles. However, the microelectronic components may shift as a result of processing temperatures and/or the flow and curing of epoxy compounds around the microelectronic components. Accordingly, there is a need for fan-out packaging that enables a high accuracy of microelectronic component positioning.

SUMMARY

According to one aspect, a wafer- or panel-level encapsulated package comprises a glass substrate comprising a glass cladding layer fused to a glass core layer, the glass substrate comprising a cavity, wherein the glass cladding layer has a higher etch rate in an etchant than the glass core layer. The wafer- or panel-level encapsulated package further comprises a microelectronic component disposed in the cavity, and an encapsulant sealed to the glass substrate such that the microelectronic component is encapsulated within the cavity.

According to a second aspect, a wafer- or panel-level encapsulated package comprises the wafer- or panel-level encapsulated package of the preceding aspect, wherein the cavity extends through the glass cladding layer to the glass core layer of the glass substrate.

According to a third aspect, a wafer- or panel-level encapsulated package comprises the wafer- or panel-level encapsulated package of any of the preceding aspects, wherein the cavity has a width that is from 0.5 to 1.5 μm greater than a width of the microelectronic component.

According to a fourth aspect, a wafer- or panel-level encapsulated package comprises the wafer- or panel-level encapsulated package of any of the preceding aspects, wherein a depth of the cavity is equal to a thickness of the glass cladding layer.

According to a fifth aspect, a wafer- or panel-level encapsulated package comprises the wafer- or panel-level encapsulated package of any of the preceding aspects, wherein the thickness of the glass cladding layer is from 5 μm to 50 μm.

According to a sixth aspect, a wafer- or panel-level encapsulated package comprises the wafer- or panel-level encapsulated package of any of the preceding aspects, further comprising a debonding layer deposited at least between the microelectronic component and a portion of the cavity and between a surface of the glass substrate and the encapsulant.

According to a seventh aspect, a wafer- or panel-level encapsulated package comprises the wafer- or panel-level encapsulated package of the sixth aspect, wherein a thickness of the debonding layer is from 1 μm to 5 μm.

According to an eighth aspect, a wafer- or panel-level encapsulated package comprises the wafer- or panel-level encapsulated package of any of the preceding aspects, wherein an angle between a side wall of the cavity and a floor of the cavity is from 75° to 90°.

According to a ninth aspect, a wafer- or panel-level encapsulated package comprises the wafer- or panel-level encapsulated package of any of the preceding aspects, wherein the encapsulant comprises an epoxy compound.

According to a tenth aspect, a wafer- or panel-level encapsulated package comprises the wafer- or panel-level encapsulated package of any of the preceding aspects, wherein a ratio of the etch rate of the glass cladding layer in the etchant to the etch rate of the glass core layer in the etchant is from 10 to 65.

According to an eleventh aspect, a method for forming a wafer- or panel-level encapsulated package comprises etching a cavity into a glass substrate comprising a glass cladding layer fused to a glass core layer, wherein the glass cladding layer has a higher etch rate in an etchant than the glass core layer. The method further comprises depositing a microelectronic component into the cavity and sealing an encapsulant to the glass substrate such that the microelectronic component is encapsulated within the cavity. The wafer- or panel-level encapsulated package is free of adhesives between the cavity and the microelectronic component.

According to a twelfth aspect, a method comprises the method of the eleventh aspect, wherein sealing the encapsulant to the glass substrate comprises flowing an epoxy compound along a surface of the glass substrate and around the microelectronic component and curing the epoxy compound.

According to a thirteenth aspect, a method comprises the method of the eleventh or twelfth aspects, wherein etching comprises wet etching.

According to a fourteenth aspect, a method comprises the method of any of the eleventh through thirteenth aspects, further comprising depositing a coating within the cavity prior to depositing the microelectronic component within the cavity.

According to a fifteenth aspect, a method comprises the method of the fourteenth aspect, wherein the coating comprises a debonding layer.

According to a sixteenth aspect, a method comprises the method of any of the fourteenth through fifteenth aspects, wherein depositing the coating comprises depositing the coating on at least a floor of the cavity.

According to a seventeenth aspect, a method comprises the method of any of the fourteenth through sixteenth aspects, further comprising depositing the coating on a surface of the glass substrate prior to sealing the encapsulant to the glass substrate, wherein the encapsulant is sealed to the surface.

According to an eighteenth aspect, a method comprises the method of any of the eleventh through seventeenth aspects, wherein a ratio of the etch rate of the glass cladding layer in the etchant to the etch rate of the glass core layer in the etchant is from 10 to 65.

According to a nineteenth aspect, a method comprises the method of any of the eleventh through eighteenth aspects, wherein an angle between a side wall of the cavity and a floor of the cavity is from 75° to 90°.

It is to be understood that both the foregoing general description and the following detailed description are merely exemplary, and are intended to provide an overview or framework to understanding the nature and character of the claimed subject matter. The accompanying drawings are included to provide a further understanding and are incorporated in and constitute a part of this specification. The drawings illustrate one or more embodiment(s), and together with the description, serve to explain principles and operation of the various embodiments.

DETAILED DESCRIPTION

Reference will now be made in detail to various embodiments which are illustrated in the accompanying drawings. Whenever possible, the same reference numerals will be used throughout the drawings to refer to the same or like parts. The components in the drawings are not necessarily to scale, emphasis instead being placed upon illustrating the principles of the exemplary embodiments.

In various embodiments, a glass article includes a glass substrate and a cavity formed in the glass substrate. In some embodiments, the glass substrate includes a glass cladding layer fused to a glass core layer, and the glass cladding layer has a higher etch rate in an etchant than the glass core layer. In various embodiments, the cavity is formed in the glass cladding layer. In various embodiments, a microelectronic component is disposed in the cavity and an encapsulant is sealed to the glass substrate such that the microelectronic component is encapsulated within the cavity. In various embodiments, the glass article is free of adhesives between the cavity and the microelectronic component.

In various embodiments, a method for forming a wafer- or panel-level encapsulated package includes depositing a microelectronic component within a cavity in a glass substrate. In some embodiments, the glass substrate includes a glass cladding layer fused to a glass core layer, and the glass cladding layer has a higher etch rate in an etchant than the glass core layer. In some embodiments, the method may further include sealing an encapsulant to the glass substrate such that the microelectronic component is encapsulated within the cavity. In various embodiments, the wafer- or panel-level encapsulated package is free of adhesives between the cavity and the microelectronic component.

In some embodiments, an integrated circuit package includes a glass article as described herein. For example, the integrated circuit package includes a microelectronic device (e.g., an integrated circuit chip) positioned in each of the one or more cavities of the glass article. Such an integrated circuit package can benefit from the glass article as described herein. For example, such glass articles may enable precise placement of microelectronic devices within cavities formed therein and prevent shifting of the microelectronic devices during processing and encapsulation without the use of adhesives between the microelectronic device and the glass article.

The term "coupled" means the joining of two members directly or indirectly to one another. Such joining may be stationary in nature or movable in nature. Such joining may be achieved with the two members or the two members and any additional intermediate members being integrally formed as a single unitary body with one another or with the two members or the two members and any additional intermediate member being attached to one another. Such joining may be permanent in nature or alternatively may be removable or releasable in nature.

The terms "glass" and "glass composition" encompass both glass materials and glass-ceramic materials, as both classes of materials are commonly understood. Likewise, the term "glass structure" encompasses structures comprising glass. The term "reconstituted wafer- and/or panel-level package" encompasses any size of reconstituted substrate package including wafer level packages and panel level packages.

The term "formed from" can mean one or more of comprises, consists essentially of, or consists of. For example, a component that is formed from a particular material can comprise the particular material, consist essentially of the particular material, or consist of the particular material.

Directional terms as used herein—for example up, down, right, left, front, back, top, bottom, vertical, horizontal—are made only with reference to the figures as drawn and are not intended to imply absolute orientation unless otherwise expressly stated.

Unless otherwise expressly stated, it is in no way intended that any method set forth herein be construed as requiring that its steps be performed in a specific order, nor that with any apparatus specific orientations be required. Accordingly, where a method claim does not actually recite an order to be followed by its steps, or that any apparatus claim does not actually recite an order or orientation to individual components, or it is not otherwise specifically stated in the claims or description that the steps are to be limited to a specific order, or that a specific order or orientation to components of an apparatus is not recited, it is in no way intended that an order or orientation be inferred, in any respect. This holds for any possible non-express basis for interpretation, including: matters of logic with respect to arrangement of steps, operational flow, order of components, or orientation of components; plain meaning derived from grammatical organization or punctuation, and; the number or type of embodiments described in the specification.

As used herein, the singular forms "a," "an" and "the" include plural referents unless the context clearly dictates otherwise. Thus, for example, reference to "a" component includes aspects having two or more such components, unless the context clearly indicates otherwise. Also, the word "or" when used without a preceding "either" (or other similar language indicating that "or" is unequivocally meant to be exclusive—e.g., only one of x or y, etc.) shall be interpreted to be inclusive (e.g., "x or y" means one or both x or y).

The term "and/or" shall also be interpreted to be inclusive (e.g., "x and/or y" means one or both x or y). In situations where "and/or" or "or" are used as a conjunction for a group of three or more items, the group should be interpreted to include one item alone, all the items together, or any combination or number of the items. Moreover, terms used in the specification and claims such as have, having, include, and including should be construed to be synonymous with the terms comprise and comprising.

All disclosed ranges are to be understood to encompass and provide support for claims that recite any and all subranges or any and all individual values subsumed by each range. For example, a stated range of 1 to 10 should be considered to include and provide support for claims that recite any and all subranges or individual values that are between and/or inclusive of the minimum value of 1 and the maximum value of 10; that is, all subranges beginning with a minimum value of 1 or more and ending with a maximum value of 10 or less (e.g., 5.5 to 10, 2.34 to 3.56, and so forth) or any values from 1 to 10 (e.g., 3, 5.8, 9.9994, and so forth).

The drawings shall be interpreted as illustrating one or more embodiments that are drawn to scale and/or one or more embodiments that are not drawn to scale. This means the drawings can be interpreted, for example, as showing: (a) everything drawn to scale, (b) nothing drawn to scale, or (c) one or more features drawn to scale and one or more features not drawn to scale. Accordingly, the drawings can serve to provide support to recite the sizes, proportions, and/or other dimensions of any of the illustrated features either alone or relative to each other. Furthermore, all such sizes, proportions, and/or other dimensions are to be understood as being variable from 0-100% in either direction and thus provide support for claims that recite such values or any and all ranges or subranges that can be formed by such values.

The terms recited in the claims should be given their ordinary and customary meaning as determined by reference to relevant entries in widely used general dictionaries and/or relevant technical dictionaries, commonly understood meanings by those in the art, etc., with the understanding that the broadest meaning imparted by any one or combination of these sources should be given to the claim terms (e.g., two or more relevant dictionary entries should be combined to provide the broadest meaning of the combination of entries, etc.) subject only to the following exceptions: (a) if a term is used in a manner that is more expansive than its ordinary and customary meaning, the term should be given its ordinary and customary meaning plus the additional expansive meaning, or (b) if a term has been explicitly defined to have a different meaning by reciting the term followed by the phrase "as used in this document shall mean" or similar language (e.g., "this term means," "this term is defined as," "for the purposes of this disclosure this term shall mean," etc.). References to specific examples, use of "i.e.," use of the word "invention," etc., are not meant to invoke exception (b) or otherwise restrict the scope of the recited claim terms. Other than situations where exception (b) applies, nothing contained in this document should be considered a disclaimer or disavowal of claim scope.

Integrated circuit (IC) packaging is the back-end process of semiconductor device fabrication, in which the block of semiconducting material is packaged in a supporting case that provides an electrical connection from the chip to the printed circuit board and prevents physical damage and corrosion to the semiconducting material. The case, known as a "package," supports the electrical contacts which connect the device to a circuit board. This process is often referred to as packaging, but also can be referred to as semiconductor device assembly, encapsulation, or sealing.

Wafer-level packaging or wafer-level chip-scale packaging (WLP) is the technology of packaging an IC (e.g., chips or dies) while still part of the wafer, in contrast to the more conventional method of slicing the wafer into individual circuits (dicing) and then packaging them. WLP can enable integration of wafer fabrication, packaging, testing, and burn-in at the wafer-level to streamline the manufacturing process undergone by a device from silicon start to customer shipment. WLP can include extending the wafer fabrication processes to include device interconnection and device protection processes. Most other kinds of packaging processes do wafer dicing first, and then put the individual die in a plastic package and attach the solder bumps. WLP involves attaching the top and bottom outer layers of packaging and the solder bumps to ICs while still in the wafer and then dicing the wafer.

One type of WLP is fan-in (FI), which has all the contact terminals within the footprint of the die. Such a configuration can pose a significant limitation when adjusting the layout of the contact terminals to match the design of the next-level substrate. Fan-out (FO) is another type of WLP that represents a compromise between die-level packaging and FI WLP. FO WLP involves dicing the semiconductor wafer and then embedding the singularized ICs in a reconstituted or artificial molded wafer. The dies are separated from each other on the reconstituted wafer by a distance that is large enough to allow the desired FO redistribution layer (RDL) to be manufactured using standard WLP processes. The FO WLP provides a way to connect the smaller die with fine lead pitch to the larger lead pitch of a printed circuit board. Fan out panel-level packaging (FO PLP) may be used as an alternative to FO WLP. Panel-level packaging (PLP) may be more cost effective than WLP because existing processes and equipment from printed circuit board (PCB) and related industries can be used instead of more expensive semiconductor processing equipment required for FO WLP.

In processes including conventional carriers (either PLP or WLP), the microelectronic components may shift as a result of processing temperatures and/or the flow and curing of epoxy compounds around the microelectronic components, decreasing the die accuracy. However, increasing accuracy demands require that shifting of the microelectronic components be reduced or eliminated. Various embodiments described herein reduce or eliminate the shifting of microelectronic components by enabling the precision etching of cavities that are precisely sized to secure the microelectronic components in place during application and curing of encapsulants, such as epoxy compounds, while eliminating the need for die attach films (DAF).

Figure 1:
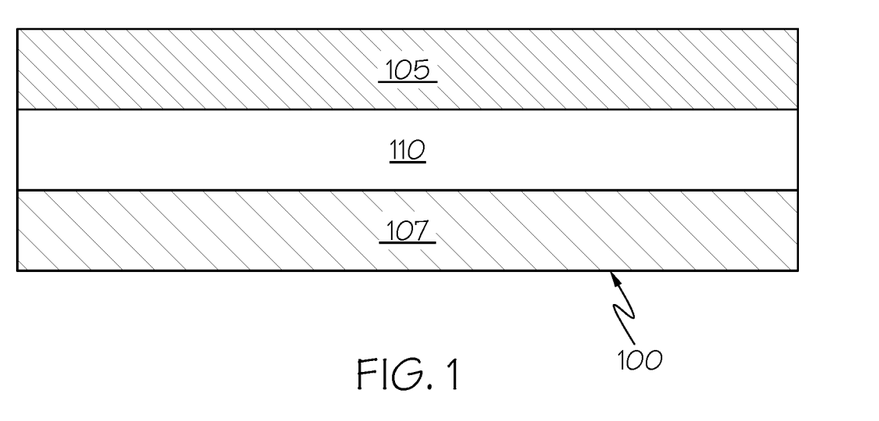
FIG. 1 is a cross-sectional schematic view of a glass substrate in accordance with one or more embodiments shown and described herein.

FIG. 1 is a cross-sectional schematic view of some embodiments of a glass substrate 100. Glass substrate 100 includes a glass core layer 110 coupled to a first or upper glass cladding layer 105 and a second or lower glass cladding layer 107. The glass substrate 100 includes multiple glass layers and can be considered a glass laminate. In some embodiments, the layers 105, 107, 110 are fused together without any adhesives, polymer layers, coating layers or the like positioned between them. In other embodiments, the layers 105, 107, 110 are coupled (e.g., adhered) together using adhesives or the like.

Glass substrate 100 can have any suitable composition and be made using any suitable method. Examples of suitable glass compositions can include alkaline-earth aluminoborosilicate glasses, zinc borosilicate glasses, and soda-lime glass as well as glass ceramics, such as those enriched with magnesium oxide, yttria, beryllia, alumina, or zirconia. In general, glass substrate 100 and any of the layers 105, 107, 110 in the glass substrate can have any of the compositions or be made using any of the methods disclosed in U.S. Pat. No. 9,340,451 entitled "Machining of Fusion-Drawn Glass Laminate Structures Containing a Photomachinable Layer," issued May 17, 2016, and U.S. Patent Application Publication No. 2017/0073266 entitled "Glass Article and Method for Forming the Same," published Mar. 16, 2017, each of which is hereby incorporated by reference in its entirety.

The glass substrate 100 is configured so that at least one of the glass cladding layers 105, 107 and the glass core layer 110 have different physical dimensions and/or physical properties that allow for selective removal of the at least one glass cladding layer 105, 107 relative to the glass core layer 110 to form precisely dimensioned cavities 425, which can be sized and shaped to receive microelectronic components.

One aspect of the glass substrate 100 that can vary widely is the thickness of the layers 105, 107, 110. For example, the layers 105, 107, 110 can all have the same thickness or different thicknesses or two of the layers can be the same thickness while the third layer has a different thickness. In some embodiments, one or both of the glass cladding layers 105, 107 may have a thickness that is less than the thickness of a microelectronic component being packaged.

In some embodiments, one or both of the glass cladding layers 105, 107 are 5 microns to 50 microns thick, 5 microns to 20 microns thick, or approximately 10 microns to approximately 15 microns thick. In other embodiments, one or both of the cladding layers 105, 107 are at least 5 microns thick or at least 10 microns thick. In other embodiments, one or both of the cladding layers 105, 107 are no more than 50 microns thick, no more than 20 microns thick or no more than 15 microns thick. These thicknesses are generally less than the thickness of microelectronic components that commonly undergo FO WLP or PLP processing. It should be appreciated, however, that the glass cladding layers 105, 107 can have other thicknesses, particularly, when used with microelectronic components having smaller or larger thicknesses than those disclosed.

Another aspect of the glass substrate 100 that can vary widely is the glass composition of the layers 105, 107, 110. For example, the layers 105, 107, 110 can all have the same glass composition or different glass compositions or two of the layers can have the same glass composition while the third layer has a different glass composition. In general, one or both of the glass cladding layers 105, 107 have a glass composition that is different than the glass composition of the glass core layer 110. This provides the glass cladding layers 105, 107 certain properties that make them suitable for the formation of the cavities 425.

In some embodiments, the glass compositions of the layers 105, 107, 110 can vary such that the durability of the layers 105, 107, 110 in an etchant varies. For example, in embodiments, one or both of the glass cladding layers 105, 107 can have a dissolution rate (or etch rate) in the etchant that is different than the glass core layer 110. The different durability between the layers 105, 107, 110 makes it possible to form the cavities 425 in the surface of the glass substrate 100. For example, the glass cladding layers 105, 107 can have a sufficiently high dissolution rate in the etchant that they can be etched to form the cavities 425. On the other hand, the glass core layer 110 can have a sufficiently low dissolution rate in the etchant that it is not substantially susceptible to being etched. Thus, the glass core layer 110 can act as an etch stop to limit the depth to which the glass substrate 100 can be etched using the etchant.

In some embodiments, one or both of the glass cladding layers 105, 107 have a dissolution rate in the etchant that is greater than the dissolution rate of the glass core layer 110. For example, the glass core layer 110 can have a dissolution rate in the etchant that is zero or sufficiently close to zero that it is insusceptible to being etched to any significant extent.

It should be appreciated that numerous changes can be made to the embodiments of the glass substrate 100 shown in FIG. 1. For example, in some embodiments, the glass substrate 100 can include only two glass layers 105, 110. In other embodiments, the glass substrate 100 can include four or more glass layers. Numerous other variations are also contemplated.

In some embodiments, cavities 425 are formed in the glass substrate 100 to transform the glass substrate into a structured article as described herein. The cavities 425 can be formed in the surface of the glass substrate 100 using the method depicted in FIG. 2. In some embodiments, the method includes forming a mask 215 on a surface of the glass substrate 100. For example, the mask 215 is formed on the surface of the glass cladding layer 105 and/or the glass cladding layer 107. The mask 215 can be formed by printing (e.g., inkjet printing, gravure printing, screen printing, or another printing process) or another deposition process. In some embodiments, the mask 215 is resistant to the etchant (e.g., the etchant that will be used to etch the cavities 425 in the glass substrate 100). For example, the mask 215 can include an acrylic ester, a multifunctional acrylate n-vinyl-caprolactam, or another suitable mask material. In some embodiments, the mask 215 is formed from an ink material comprising a primer to enhance adhesion between the mask and the glass substrate 100. Such enhanced adhesion can reduce seepage of the etchant between the mask 215 and the glass substrate 100, which can help to enable the precise cavities described herein.

Figure 2:
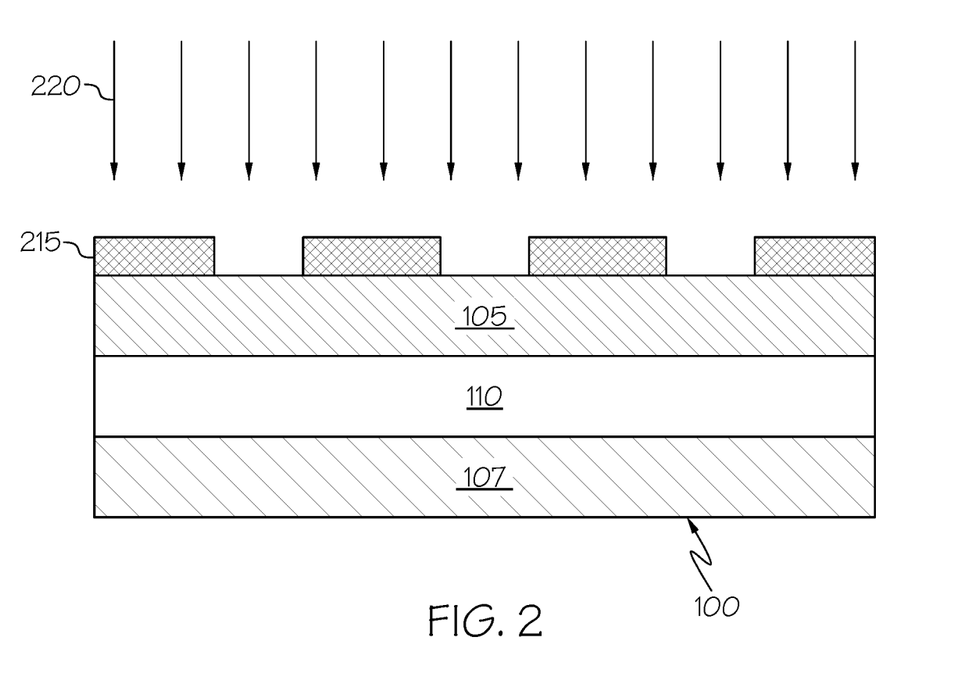
FIG. 2 is a cross-sectional schematic view of the glass substrate in FIG. 1 as it is selectively exposed to an etchant through a mask to form cavities in a cladding layer in accordance with one or more embodiments shown and described herein.

In some embodiments, the mask 215 includes one or more open regions at which the glass substrate 100 remains uncovered. The open regions of the mask 215 can have a pattern corresponding to the desired pattern of the cavities 245 to be formed in the glass substrate 100. For example, the pattern of the mask 215 can be an array of regularly repeating rectangular shapes (e.g., to receive microelectronic components as described herein). In such embodiments, the shapes patterned by the mask 215 can correspond closely to the shape of the microelectronic components. Other shapes also can be used, and the shapes can correspond closely to the shape of the microelectronic component or be capable of securely holding the microelectronic component in position on the glass substrate 100. Thus, the mask 215 can be configured as an etch mask to enable selective etching of the glass cladding layer 105 and/or the glass cladding layer 107 and form the cavities 425 in the glass substrate 100 as described herein.

In some embodiments, the glass substrate 100 with the mask 215 disposed thereon is exposed to the etchant 220. For example, the glass cladding layer 105 and/or the glass cladding layer 107 is contacted with the etchant 220 as shown in FIG. 2, thereby selectively etching an exposed portion of the respective glass cladding layer that is uncovered by the mask 215 and forming the cavities 425 in the glass substrate, thereby transforming the substrate into the shaped article. Thus, following formation of the cavities 425, the glass substrate 100 can be referred to as the shaped article. In some embodiments, the glass substrate 100 with the mask 215 disposed thereon is exposed to the etchant 220 at an etching temperature and for an etching time. For example, the etching temperature is 20° C., 22° C., 25° C., 30° C., 35° C., 40° C., 45° C., or 50° C., or any ranges defined by any combination of the stated values. A lower etching temperature can help to maintain the integrity of the mask 215 during the etching, which can enable an increased etching time and/or improved cavity shape as described herein. Additionally, or alternatively, the etching time can be 10 minutes, 15 minutes, 20 minutes, 25 minutes, 30 minutes, 35 minutes, 40 minutes, 45 minutes, 50 minutes, 55 minutes, 60 minutes, 65 minutes, 70 minutes, 75 minutes, 80 minutes, 85 minutes, or 90 minutes, or any ranges defined by any combination of the stated values. A relatively long etching time (e.g., an etching time of greater than 10 minutes) can enable substantially vertical sidewalls of the cavities 425 as described herein.

In some embodiments, the glass cladding layer 105 and/or the glass cladding layer 107 etch at least 1.5 times faster, at least 2 times faster, at least 5 times faster, at least 10 times faster, at least 20 times faster, or at least 60 times faster than the glass core layer 110. As used herein, the "etch rate" refers to the thickness per unit of time. For example, in some embodiments, the etch rate may be 8 µm/minute. Additionally, or alternatively, a ratio of the dissolution rate of the glass cladding layer in the etchant to the dissolution rate of the glass core layer in the etchant is greater than or equal to 10 and less than or equal to 65. For example, the ratio may be greater than or equal to 10, greater than or equal to 15, greater than or equal to 20, greater than or equal to 25, greater than or equal to 30, greater than or equal to 35, greater than or equal to 40, greater than or equal to 45, greater than or equal to 50, greater than or equal to 55, or greater than or equal to 60. The ratio may be less than or equal to 65, less than or equal to 60, less than or equal to 55, less than or equal to 50, less than or equal to 45, less than or equal to 40, less than or equal to 35, less than or equal to 30, less than or equal to 25, less than or equal to 20, or less than or equal to 15. In some embodiments, the ratio may be any range defined by any combination of the stated values.

Figure 3:
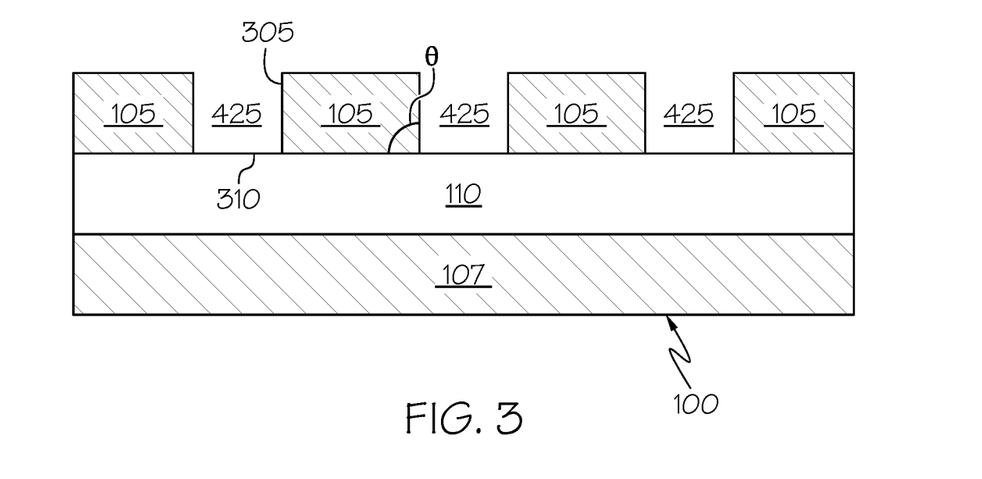
FIG. 3 is a cross-sectional schematic view of the glass substrate in FIGS. 1-2 after forming cavities therein and removing the mask in accordance with one or more embodiments shown and described herein.

In some embodiments, the forming the cavities 425 includes etching substantially entirely through the glass cladding layer 105 and/or the glass cladding layer 107 to expose a portion of the glass core layer 110 at the bottom of the cavities, as shown in FIG. 3. Thus, the sidewalls 305 of the cavities 425 are defined by the glass cladding layer 105 and/or the glass cladding layer 107, and the floors 310 of the cavities are defined by the glass core layer 110. In some embodiments, the glass core layer 110 is not substantially etched during the forming the cavities 425. Thus, the glass core layer 110 serves as an etch stop that determines the depth of the cavities 425.

In some embodiments, the floor 310 of each of the cavities 425 is substantially flat. For example, a difference between a first depth of the cavity 425 at a first position along the perimeter of the cavity 425 and a second depth of the cavity 425 at a second position along the perimeter of the cavity 425 opposite the first position (e.g., diametrically opposed) is at most 3 µm, at most 2 µm, at most 1 µm, at most 0.9 µm, at most 0.8 µm, at most 0.7 µm, at most 0.6 µm, at most 0.5 µm, at most 0.4 µm, at most 0.3 µm, at most 0.2 µm, or at most 0.1 µm. In some embodiments, the difference may be any range defined by any combination of the stated values. Such a low depth difference can be enabled by the etch stop provided by the glass core layer 110. For example, the depth of the cavity 425 can be determined primarily by the thickness t of the glass cladding layer 105 and/or the glass cladding layer 107 without changing substantially as a result of changes in etch temperature and/or etch time.

In some embodiments, the sidewalls 305 of the cavities 425 are substantially vertical. For example, an angle θ formed between the sidewall 305 and the floor 310 of the cavity 425 (shown in FIG. 3) is 90°, or from 75° to 90°. In some of such embodiments, the depth of the cavity is at least 2 µm, at least 5 µm, at least 10 µm, at least 12 µm, or at least about 15 µm. In some embodiments, the depth may be any range defined by any combination of the stated values. Such a low angle of the sidewalls can be enabled by an increased etching time, which can be enabled by the etch stop provided by the glass core layer 110. For example, the etching time can be extended to remove material at the intersection between the sidewalls and the floor near the bottom of the cavity without substantially increasing the depth of the cavity. Removing such material can result in a straighter (e.g., vertical) sidewall compared to conventional wet etching processes.

Figure 4:
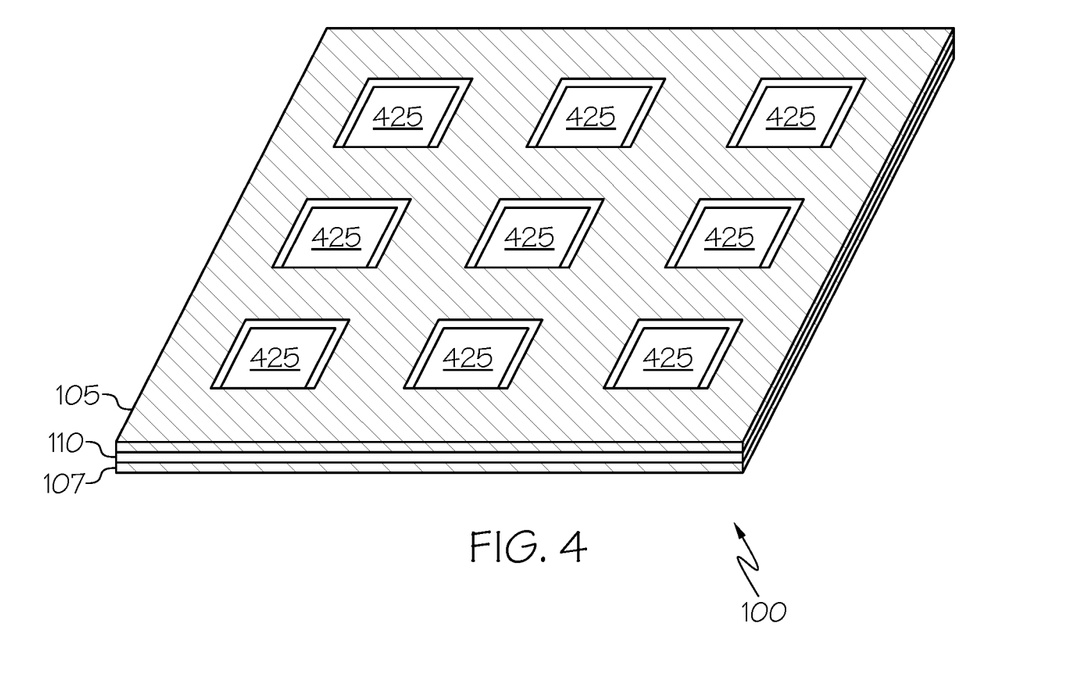
FIG. 4 is a perspective view, respectively, of the glass substrate in FIGS. 1-2 after forming cavities therein and removing the mask in accordance with one or more embodiments shown and described herein.

In some embodiments, following the forming the cavities 425, the mask 215 is removed from the glass substrate 100. For example, the removing the mask 215 includes contacting the mask with a solvent, thereby removing the mask from the surface of the glass substrate. In some embodiments, the solvent is water. For example, the removing the mask 215 includes submerging the glass substrate 100 with the mask 215 disposed thereon into water, thereby removing the mask from the surface of the glass substrate. FIGS. 3-4 are cross-sectional schematic and perspective views, respectively, of the glass substrate 100 with the cavities 425 formed therein and the mask 215 removed therefrom. Additional details on the formation of cavities 425 within the glass substrate 100 may be found in Patent Application No. 62/582,297, filed Nov. 6, 2017, and entitled "Precision Structured Glass Articles, Integrated Circuit Packages, Optical Devices, Microfluidic Devices, and Methods for Making the Same," which is incorporated by reference herein in its entirety.

The cavities 425 shown in FIGS. 3-4 have a rectangular shape (as can be seen in FIG. 4) that corresponds to the shape of the microelectronic components 700. It should be appreciated, however, that the cavities 425 can have any suitable shape, and can vary depending on the particular microelectronic component to be fixed therein. For example, the cavities 425 can have a square shape, a circular shape, or any other polygonal or non-polygonal shape.

Figure 5:
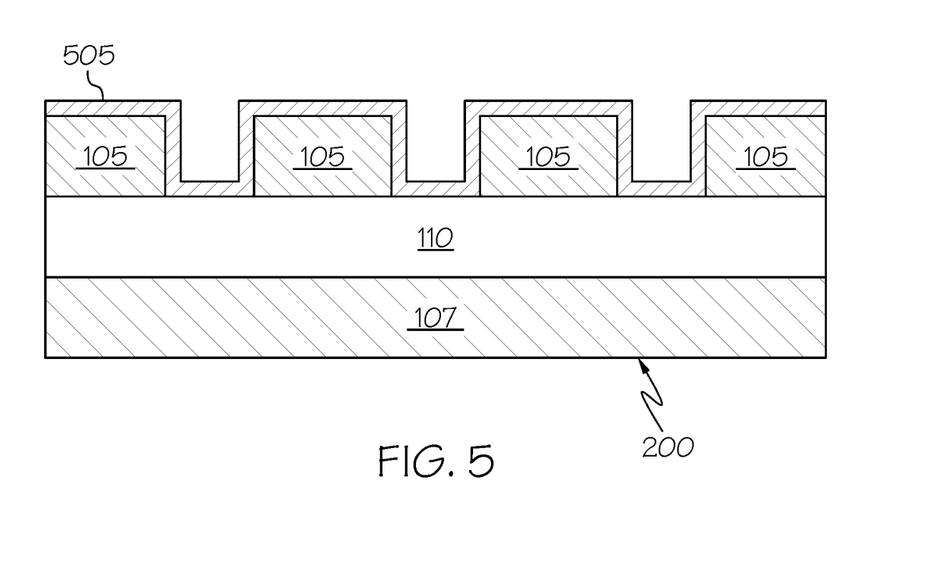
FIG. 5 is a cross-sectional schematic view of an embodiment of a reconstituted wafer- and/or panel-level package having a debonding layer deposited along the sidewalls and floors of the cavities in accordance with one or more embodiments shown and described herein.
Figure 6:
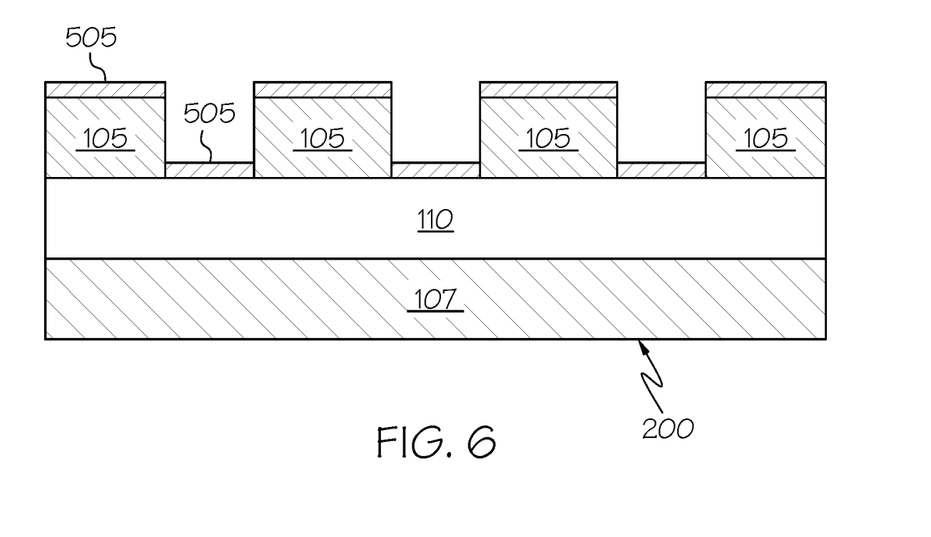
FIG. 6 is a cross-sectional schematic view of an embodiment of a reconstituted wafer- and/or panel-level package having a debonding layer deposited along the floors of the cavities in accordance with one or more embodiments shown and described herein.

As shown in FIG. 5, in various embodiments, a coating in the form of a debonding layer 505 may be disposed along the sidewall 305 and the floor 310 of each of the cavities 425. This arrangement may enable the microelectronic component positioned within the cavity 425 to be easily removed from the cavity 425 when the glass article is removed as the carrier. Additionally, such an arrangement will enable debonding of the sealant from the glass carrier after processing when the sealant flows into the cavity 425 around the microelectronic component, as will be described in greater detail below. However, it is also contemplated that the debonding layer 505 may be removed from the sidewalls 305 of the cavity 425, such as depicted in FIG. 6, and/or from the top surface of the glass substrate (not shown). In some embodiments, such as the embodiments shown in FIGS. 5 and 6, the debonding layer 505 can be additionally deposited on the surface of the glass cladding layer 105 between adjacent cavities 425 in addition to being deposited within the cavities 425. In some other embodiments, the debonding layer 505 may be deposited along the top surface of the glass cladding layer 105 between adjacent cavities 425, but not within the cavities 425.

Figure 7:
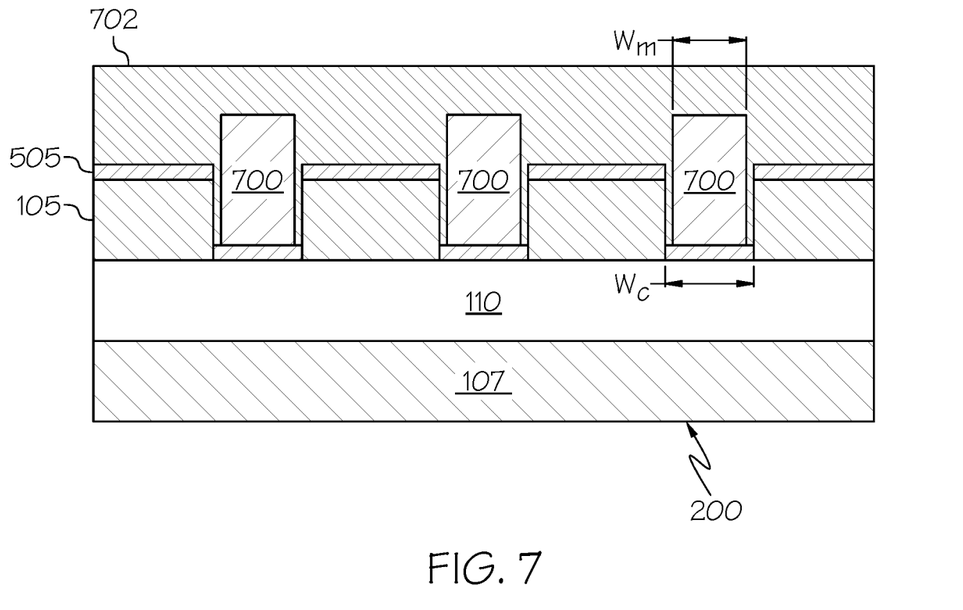
FIG. 7 is a cross-sectional schematic view of a reconstituted wafer- and/or panel-level package having an encapsulant positioned on the glass substrate and around the microelectronic components in accordance with one or more embodiments shown and described herein.

The debonding layer 505, sometimes referred to as a release layer, can be any suitable layer that enables temporary bonding between the glass substrate 100 and the encapsulant 702 (shown in FIG. 7). In some embodiments, the debonding layer 505 may be a light-to-heat conversion release coating (LTHC), or a UV or IR ablation layer, for example. The debonding layer 505 may be applied to the glass substrate 100 and, when applied to the glass substrate, is chemically and thermally stable to fully withstand processing conditions.

Prior to removal of the glass substrate 100 from the encapsulant 702, the debonding layer 505 may be ablated or otherwise broken down to release the glass substrate 100 from the encapsulant 702. The debonding layer 505 can be formed, for example, by spin coating or spraying the debonding layer material onto the glass substrate 100. In some embodiments, depending on the particular compositional makeup of the debonding layer 505, the debonding layer 505 may be cured. Other methods of forming the debonding layer 505 may be employed.

In various embodiments, the debonding layer 505 has a thickness of from 1 μm to 5 μm, or from 2 μm to 3 μm. For example, the debonding layer 505 may have a thickness of 1 μm, 1.2 μm, 1.5 μm, 1.7 μm, 1.9 μm, 2.0 μm, 2.1 μm, 2.2 μm, 2.3 μm, 2.4 μm, 2.5 μm, 2.6 μm, 2.7 μm, 2.8 μm, 2.9 μm, 3.0 μm. 3.2 μm, 3.5 μm, 3.7 μm, 3.9 μm, 4.0 μm, 4.2 μm, 4.5 μm, 4.7 μm, or 5.0 μm. In some embodiments, the thickness may be any range defined by any combination of the stated values. In some other embodiments, the debonding layer 505 may have a thickness of greater than 3 μm, although additional thickness may result in additional shift of the microelectronic component within the cavity.

In some embodiments, the microelectronic component 700 is placed within the cavity 425, and the encapsulant 702 can be directly filled around the microelectronic component 700 the cavity 425. For example, in various embodiments, the cavity 425 may have a width Wc that is from 0.5 μm to 1.5 μm greater than a width $W_m$ of the microelectronic component 700. For example, the width $W_c$ may be 0.5 μm, 0.6 μm, 0.7 μm, 0.8 μm, 0.9 μm, 1.0 μm, 1.1 μm, 1.2 μm, 1.3 μm, 1.4 μm, or 1.5 μm greater than a width $W_m$ of the microelectronic component 700. In some embodiments, the difference in the widths may be any range defined by any combination of the stated values. Without being bound by theory, it is believed that a small amount of space between at least part of the cavity wall and the microelectronic component 700 can enable both the glass substrate and the microelectronic component to expand and contract during processing without generating additional stresses due to the contact between the cavity and the microelectronic component 700 while preventing shifting of the microelectronic component 700 outside of the tolerance ranges. Additionally, the difference in widths of the cavity and the microelectronic component permit the encapsulant 702 to further surround the microelectronic component 700, securing it in place.

In some embodiments, the sidewalls 305 of the cavities 425 may have an angle θ (shown in FIG. 3) less than 90° relative to the floor 310 of the cavities 425 to enable the encapsulant 702 to be deposited between the microelectronic component 700 and the sidewall 305. In other words, in embodiments in which the encapsulant 702 is filled between the microelectronic component 700 and the sidewalls 305, each cavity 425 may have a width greater at the top surface of the glass substrate than a width along the floor 310 of the cavity 425. In some other embodiments, the sidewalls 305 of the cavities 425 may have an angle θ equal to 90° relative to the floor 310 of the cavities 425. However, the particular angle of the sidewall relative to the floor of the cavity may vary.

In some embodiments, the microelectronic components 700 are silicon based IC chips, antennas, sensors, or the like. More particularly, by way of example and not limitation, the microelectronic component 700 may be a MEMS sensor, a MEMS mirror, a quantum dot, an image sensor, or an LED. In various embodiments, the microelectronic components 700 have a thickness that is greater than or equal to the thickness of the glass cladding layer 105. In other words, in some embodiments, the microelectronic components 700 have a thickness that is greater than or equal to the depth of the cavity 425. In such embodiments, the microelectronic components 700 are not flush with the surface of the glass cladding layer 105, enabling the encapsulant 702 to flow around the microelectronic components 700 and fix them into place.

The encapsulant 702 may be any type of molding compound, including but not limited to composite materials consisting of epoxy resins, phenolic hardeners, silicas, catalyst, pigments, and mold release agents, and other molding compounds known and used in the art. The particular encapsulant 702 selected may vary depending on its glass transition temperature, moisture absorption rate, flexural modulus/strength, coefficient of thermal expansion, thermal conductivity and adhesion properties in relation to the processing steps and final application for the microelectronic components encapsulated therein. In various embodiments described herein, the encapsulant comprises an epoxy compound.

In some embodiments, the glass article can be used as an integrated circuit package, and in particular, as a glass fan-out. For example, microelectronic components 700, which can be diced from an underlying wafer, are placed in the cavities 425 to form a reconstituted wafer- and/or panel-level package 200, as shown in FIGS. 5-7. The cavities 425 can be configured to receive any suitable microelectronic components 700. In some embodiments, the microelectronic components 700 are silicon based IC chips, antennas, sensors, or the like.

Following etching the cavities 425 into the glass substrate 100 and optionally depositing a debonding layer 505 on one or more surfaces of the glass substrate 100, a microelectronic component 700 is deposited in each corresponding cavity 425. As mentioned above, it can be desirable for the microelectronic components 700 to extend above with the top surface of the glass cladding layer 105 and/or the glass cladding layer 107. Once the microelectronic components 700 are deposited within the cavities 425, the encapsulant 702 is sealed to the glass substrate such that the microelectronic components 700 are encapsulated within the cavities 425.

In some embodiments, such as embodiments in which the encapsulant 702 is an epoxy compound, the encapsulant 702 is sealed to the glass substrate by flowing the epoxy compound along the top surface of the glass substrate (e.g., along the top surface of the glass cladding layer 105 in FIG. 7) and around the microelectronic components 700, and curing the epoxy compound. Other methods of sealing the encapsulant 702 to the glass substrate may be employed, depending on the particular encapsulant used.

In some embodiments, after the epoxy compound is cured, the die can be debonded from the glass substrate, exposing the microelectronic components 700 fixed to the encapsulant 702. Debonding can be performed according to techniques known in the art, and may depend on the type of debonding layer employed. In some embodiments, the die may be further processed, such as by grinding or polishing an inactive side of the die to produce a flat surface. Other processing steps are possible and contemplated.

In various embodiments described herein, the packages are free of adhesives between the cavity 425 and the microelectronic component 700. For example, while conventional wafer-level packages employ a die attach film (DAF) to bond the microelectronic component 700 to the cavity 425, the embodiments described herein provide a precision fit between the cavity 425 and the microelectronic component 700 to enable the microelectronic component 700 to be held in place during the flowing and curing of the encapsulant without requiring the use of the DAF or other adhesives. Thus, various embodiments described herein reduce or eliminate die shift caused by the flow and curing of the encapsulant while further simplifying the manufacturing method by eliminating the need for a DAF or other adhesive to secure the microelectronic component into place.

In various embodiments, a reconstituted wafer- and/or panel-level package is described as comprising a glass substrate comprising a plurality of cavities and a microelectronic component positioned in each one of the plurality of cavities in the glass substrate. It should be noted that such a reconstituted wafer- and/or panel-level package may have additional cavities with or without microelectronic components positioned therein. For example, in some embodiments, a reconstituted wafer- and/or panel-level package includes a plurality of cavities with a microelectronic component positioned in each one of the plurality of cavities and one or more additional cavities that are free of a microelectronic component positioned therein. In other embodiments, a reconstituted wafer- and/or panel-level package includes a plurality of cavities with a microelectronic component positioned in each one of the plurality of cavities and is free of additional cavities.

The subject matter recited in the claims is not coextensive with and should not be interpreted to be coextensive with any embodiment, feature, or combination of features described or illustrated in this document. This is true even if only a single embodiment of the feature or combination of features is illustrated and described in this document.

It will be apparent to those skilled in the art that various modifications and variations can be made without departing from the spirit or scope of the claimed subject matter. Accordingly, the claimed subject matter is not to be restricted except in light of the attached claims and their equivalents.

What is claimed is:

1. A wafer- or panel-level encapsulated package comprising:
    a glass substrate comprising a glass cladding layer fused to a glass core layer, the glass substrate comprising a cavity, wherein the glass cladding layer has a higher etch rate in an etchant than the glass core layer;
    a microelectronic component disposed in the cavity;
    an encapsulant sealed to the glass substrate such that the microelectronic component is encapsulated within the cavity, the encapsulant comprising an epoxy compound; and
    wherein the wafer- or panel-level encapsulated package is free of adhesives between the cavity and the microelectronic component.

2. The wafer- or panel-level encapsulated package of claim 1, wherein the cavity extends through the glass cladding layer to the glass core layer of the glass substrate.

3. The wafer- or panel-level encapsulated package of claim 1, wherein the cavity has a width that is from 0.5 to 1.5 μm greater than a width of the microelectronic component.

4. The wafer- or panel-level encapsulated package of claim 1, wherein a depth of the cavity is equal to a thickness of the glass cladding layer.

5. The wafer- or panel-level encapsulated package of claim 4, wherein the thickness of the glass cladding layer is from 5 μm to 50 μm.

6. The wafer- or panel-level encapsulated package of claim 1, further comprising a debonding layer deposited at least between the microelectronic component and a portion of the cavity and between a surface of the glass substrate and the encapsulant.

7. The wafer- or panel-level encapsulated package of claim 6, wherein a thickness of the debonding layer is from 1 μm to 5 μm.

8. The wafer- or panel-level encapsulated package of claim 1, wherein an angle between a side wall of the cavity and a floor of the cavity is from 75° to 90°.

9. The wafer- or panel-level encapsulated package of claim 1, wherein the encapsulant comprises an epoxy compound.

10. The wafer- or panel-level encapsulated package of claim 1, wherein a ratio of the etch rate of the glass cladding layer in the etchant to the etch rate of the glass core layer in the etchant is from 10 to 65.

11. A method for forming a wafer- or panel-level encapsulated package, comprising:
    etching a cavity into a glass substrate comprising a glass cladding layer fused to a glass core layer, wherein the glass cladding layer has a higher etch rate in an etchant than the glass core layer;
    depositing a microelectronic component into the cavity;
    sealing an encapsulant to the glass substrate such that the microelectronic component is encapsulated within the cavity, the encapsulant comprising an epoxy compound; and
    wherein the wafer- or panel-level encapsulated package is free of adhesives between the cavity and the microelectronic component.

12. The method of claim 11, wherein sealing the encapsulant to the glass substrate comprises flowing the epoxy compound along a surface of the glass substrate and around the microelectronic component and curing the epoxy compound.

13. The method of claim 11, wherein etching comprises wet etching.

14. The method of claim 11, further comprising:
depositing a coating within the cavity prior to depositing the microelectronic component within the cavity.

15. The method of claim 14, wherein the coating comprises a debonding layer.

16. The method of claim 14, wherein depositing the coating comprises depositing the coating on at least a floor of the cavity.

17. The method of claim 14, further comprising:
depositing the coating on a surface of the glass substrate prior to sealing the encapsulant to the glass substrate, wherein the encapsulant is sealed to the surface.

18. The method of claim 11, wherein a ratio of the etch rate of the glass cladding layer in the etchant to the etch rate of the glass core layer in the etchant is from 10 to 65.

19. The method of claim 11, wherein an angle between a side wall of the cavity and a floor of the cavity is from 75° to 90°.

* * * * *